United States Patent [19]

Shigemitsu et al.

[11] Patent Number: 4,840,874
[45] Date of Patent: Jun. 20, 1989

[54] METHOD OF FORMING RESIST PATTERN

[75] Inventors: Fumiaki Shigemitsu; Kinya Usuda; Tatsuo Nomaki, all of Yokohama, Japan

[73] Assignee: Kabushiki Kaisha Toshiba, Kawasaki, Japan

[21] Appl. No.: 99,895

[22] Filed: Sep. 22, 1987

[30] Foreign Application Priority Data

Sep. 25, 1986 [JP] Japan ................................. 61-226901

[51] Int. Cl.⁴ ............................................. G03C 5/16
[52] U.S. Cl. ................................... 430/296; 430/311; 430/325; 430/326; 430/327; 430/330
[58] Field of Search ................. 430/30, 325, 326, 327, 430/330, 296, 311

[56] References Cited

U.S. PATENT DOCUMENTS

| | | | |
|---|---|---|---|
| 3,939,000 | 2/1976 | Arvidson, Jr. et al. | 96/87 |
| 4,115,120 | 9/1978 | Dyer et al. | 96/36.2 |
| 4,202,623 | 5/1980 | Watkin | 355/30 |
| 4,241,165 | 12/1980 | Hughes et al. | 430/269 |
| 4,286,052 | 8/1981 | Ernsberger | 430/330 |
| 4,304,119 | 12/1981 | Uchigaki | 73/17 |
| 4,335,957 | 6/1982 | Nonaka et al. | 355/30 |
| 4,406,269 | 9/1983 | Asaka et al. | 123/549 |
| 4,421,844 | 12/1983 | Buhr et al. | 430/326 |
| 4,423,137 | 12/1983 | Rester | 430/320 |
| 4,432,635 | 2/1984 | Mayer | 355/30 |
| 4,503,335 | 3/1985 | Takahashi | 250/548 |
| 4,590,149 | 5/1986 | Nakane | 430/325 |
| 4,717,645 | 1/1988 | Kato et al. | 430/296 |

FOREIGN PATENT DOCUMENTS

| | | |
|---|---|---|
| 58-199349 | 11/1983 | Japan . |
| 59-132127 | 7/1984 | Japan . |
| 59-132128 | 7/1984 | Japan . |
| 59-132618 | 7/1984 | Japan . |
| 59-132619 | 7/1984 | Japan . |

OTHER PUBLICATIONS

MacBeth, "Prebaking Positive Photoresists", Eastman Kodak Company INTERFACE '82 Microelectronics Seminar, Oct. 22, 1982, Eaton Corporation, Semiconductor Equipment.
F. Shigemitsu et al., SPIE's 1987 Santa Clara Symposium on Microlithography, "Highly Sensitized Electron-Beam Resist by Means of a Quenching Process", vol. 771, Mar. 2-3, 1987.
W. S. DeForest, Photoresist Materials and Processes, "Microelectronic Applications", Chapter seven, pp. 213-214.
Gordan MacBeth et al., Prebaking Positive Photoresists, Microelectronics Seminar, San Diego, Calif., Oct. 22, 1982.
Michael Hatzakis, Proceedings of the IEEE, "Resists for Fine-Line Lithography", vol. 71, No. 5, pp. 570-574, May 1983.
David J. Elliott, Integrated Circuit Fabrication Technology, "Resist Quality Control", pp. 312-319, 1982.
Shipley Microposit Photoresist Technical Manual, "Shipley Photo Resists", p. 1.
W. S. DeForest, Photoresist Materials and Processes, "Types of Photoresists", pp. 52-55, Jan. 1975.
Shigemitsu et al., "Highly Sensitized E-Beam Resist by Means of Quenching", SPIE, 1987, Symp., Santa Clara, Calif.

Primary Examiner—Jose G. Dees
Attorney, Agent, or Firm—Foley & Lardner, Schwartz, Jeffery, Schwaab, Mack, Blumenthal & Evans

[57] ABSTRACT

A method of forming a resist pattern on a substrate such as a mask substrate for use in manufacturing semiconductor devices or a semiconductor substrate at the intermediate step for manufacturing semiconductor devices includes the steps of baking a resist coated on the substrate at a temperature in its Tg region (glass transition temperature region) or higher temperature, and annealing the resist at a temperature within the Tg region.

11 Claims, 8 Drawing Sheets

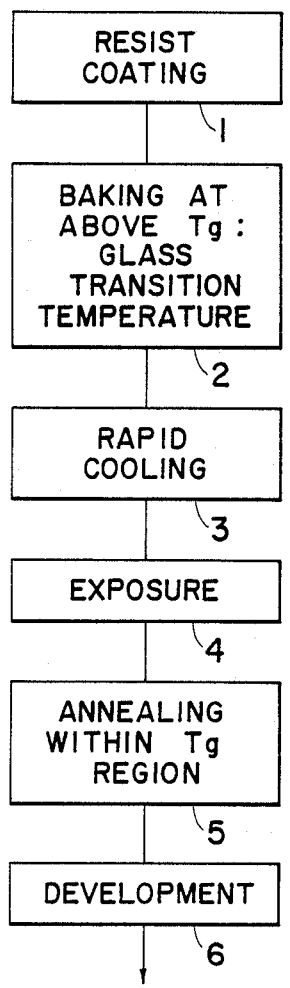
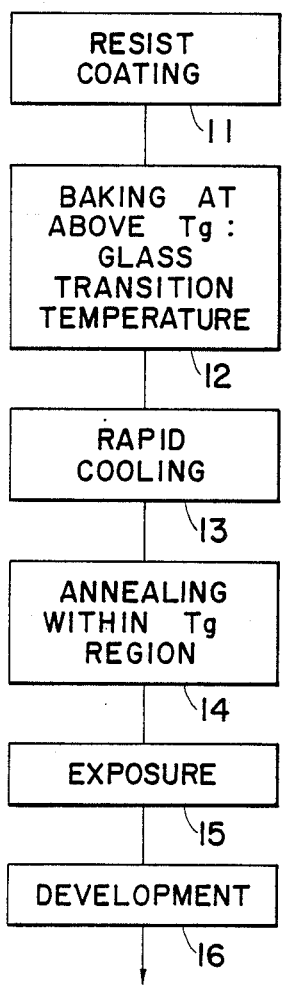
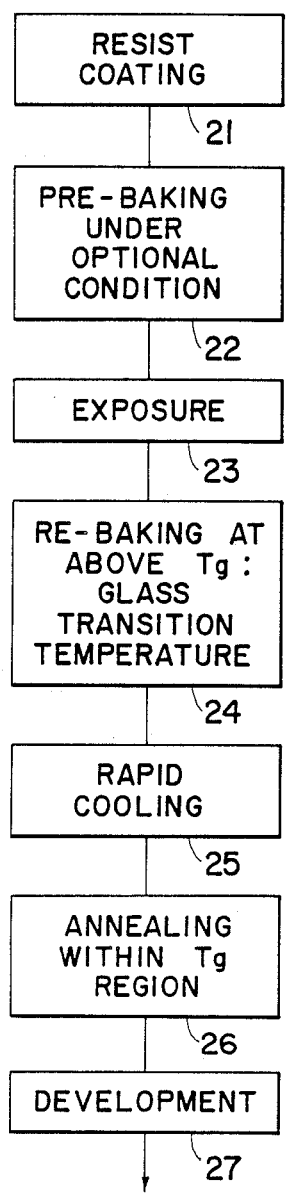
FIG. 6
FIG. 7
FIG. 8

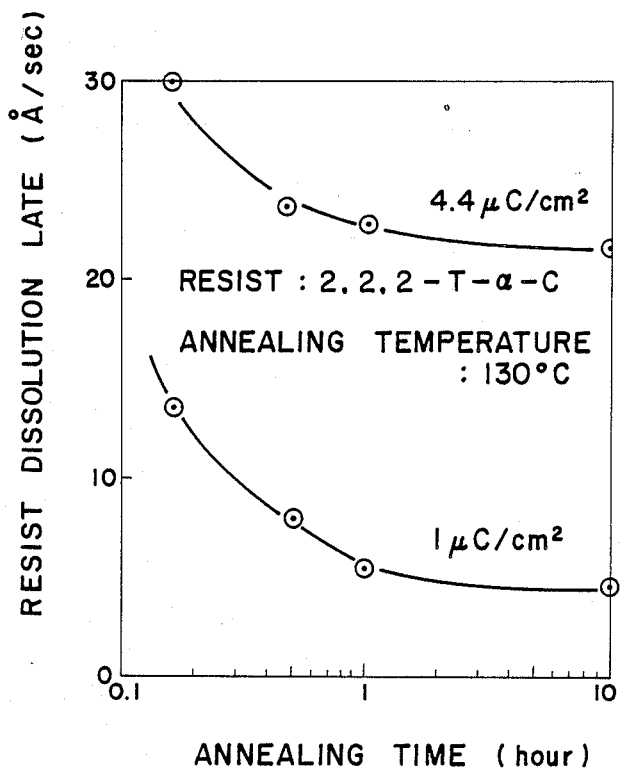
F I G. 13
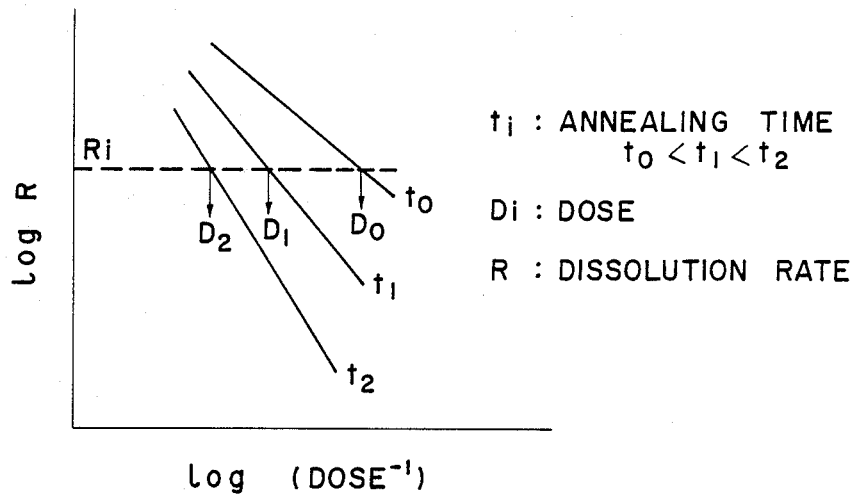
F I G. 14

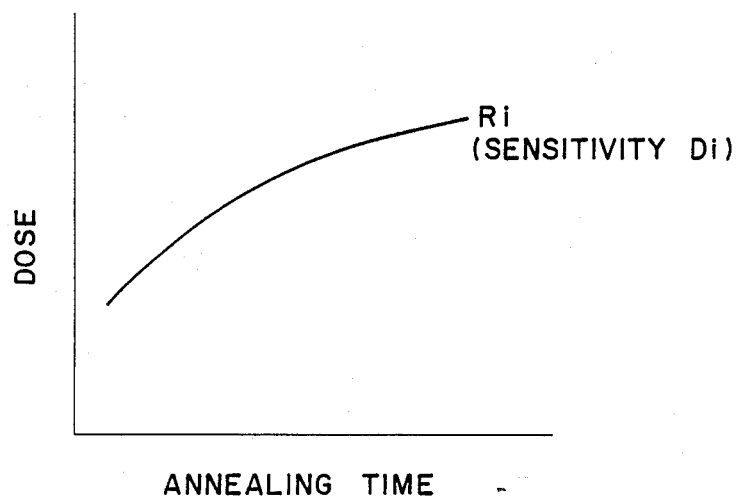
F I G. 15

METHOD OF FORMING RESIST PATTERN

BACKGROUND OF THE INVENTION

As the degree of integration of semiconductor devices such as VLSIs becomes high, a technique for forming a fine pattern with high precision becomes necessary. In such a pattern forming technique, the allowable dimensional precision is extremely severe. For example, in the most sophisticated field of such pattern forming technology, a dimensional precision of $3\sigma \leq 0.1$ μm (where o indicates a standard deviation of average dimensions of masks or wafers) is required for the formation of patterns on 6-inch masks or 5-inch wafers. Further, in order to form patterns on masks or wafers in mass production, a dimensional scattering among a plurality of masks or wafers should be suppressed within $3\sigma \leq 0.15$ μm. Apart from the above, in order to improve the productivity, a resist of high sensitivity is required, and, in addition, the sensitivity of a resist should be controlled to meet the sensitivity of the exposure apparatus (energy irradiating apparatus) to be used.

Resists have been formed heretofore in the following conventional manner:

First, a resist is coated on a substrate to be processed (e.g., a mask substrate) by the spin coating method or the dipping method. Next the resist film on the substrate to be processed (hereinafter referred to as substrate) is heated (baked) at a specific temperature by heating means such as an oven or a hot plate. The resist film is baked for a specific time, and thereafter the substrate with the baked resist film is left to cool naturally for about 20 to 30 minutes at room temperature and atmospheric pressure to cool it down to the room temperature. Thereafter, the resist film on the cooled substrate is exposed to light of a specific light quantity corresponding to the standard sensitivity of the resist. After specific development and rinse processes, resist patterns are formed.

With the above conventional method, however, it is difficult to adjust the sensitivity of each resist coated on a plurality of substrates, even if resists of the same type are used. Therefore, even under the same exposure and other process conditions for manufacturing semiconductor devices, proper exposure and other process conditions for each resist on a plurality of substrates are not necessarily ensured, it is not possible to form a satisfactory resist pattern on each substrate. In addition, the sensitivity of a resist film is not uniform even on a single substrate so that it is difficult to form a resist pattern having a uniform dimension even on a single substrate.

SUMMARY OF THE INVENTION

The present invention has been made in consideration of the above circumstances and seeks to provide a method of forming a resist pattern with high precision capable of stably adjusting the resist sensitivity to a desired value.

The above object can be achieved by the method of forming a resist pattern of this invention, which comprises the steps of baking a resist coated on a substrate at a temperature in its glass transition temperature region or higher temperature, and annealing the resist at a temperature within the glass transition temperature range.

According to the present invention, it is possible to stably adjust the sensitivity of a resist. Therefore, it becomes possible to easily control the exposure and other process conditions to suit the resist sensitivity, thus producing a resist pattern of high precision.

BRIEF DESCRIPTION OF THE DRAWINGS

In the drawings:

FIG. 6 is flow diagram indicating the process steps of a first embodiment of the method of forming a resist pattern according to the invention;

FIG. 7 is a flow diagram indicating the process steps of a second embodiment of the method of forming a resist pattern according to the invention;

FIG. 8 is a flow diagram indicating the process steps of a third embodiment of the method of forming a resist pattern according to the invention;

FIG. 13 is a graph showing a relation between an annealing time and a resist dissolution rate;

FIG. 14 is a graph showing a relation between a dose and a resist dissolution rate; and FIG. 15 is a graph showing a relation between a dose and an annealing time required to obtain a dissolution rate Ri (effective sensitivity Di).

DETAILED DESCRIPTION OF THE INVENTION

Prior to a description of an embodiment of this invention, the principle of the invention will first be described.

The principle of the invention is summarized as follows. If, after a resist has been baked at a temperature higher than its Tg region (glass transition temperature region), it is rapidly cooled or quenched, then the enthalpy of the resist is frozen in a high state. Therefore, the sensitivity of the resist during development, i.e., the solubility is also maintained in a high state. If the resist is annealed (heated) after the above processes at a temperature within the Tg region, the resist enthalpy relaxation, i.e., the volume relaxation proceeds so that the resist sensitivity (solubility) decreases. Therefore, if the relation between the annealing temperature and time and the sensitivity of a resist are obtained beforehand, the sensitivity of resists of a same type can be made different, whereby adjustment of a resist sensitivity to a desired value becomes possible.

Figure 1:
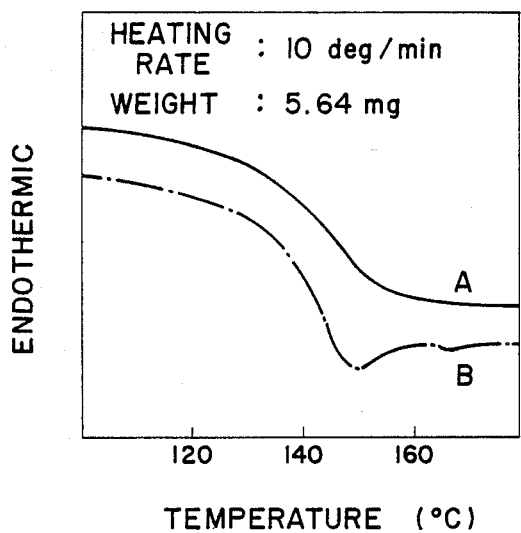
FIG. 1 is a DSC (Differential Scanning Calorimeter) diagram obtained through DSC scans for resists baked and thereafter subjected to different cooling rates.

The principle of the invention summarized above will be described in more detail in the following. Curves A and B shown in FIG. 1 are the measurement results of resists by a differential scanning calorimeter (DSC) in which 2,2,2-trifluoroethyl-α-chloroacrylate (hereinafter abbreviated as 2,2,2-gT-α-C; its commercial name: EBR-9) which is of the positive type having a sensitivity to an electron beam is used as a resist. Each resist was baked at a temperature in its Tg region or higher temperature and thereafter rapidly cooled at a different cooling rate. The curve A in FIG. 1 represents a DSC curve for a resist which was quenched at a cooling rate of 160° C./sec, while the curve B represents a DSC curve for a resist which was slowly cooled at a cooling rate of 2° C./min. An endothermic peak is present for the curve B at the Tg region, whereas there is no peak at the Tg region for the curve A.

Figure 2:
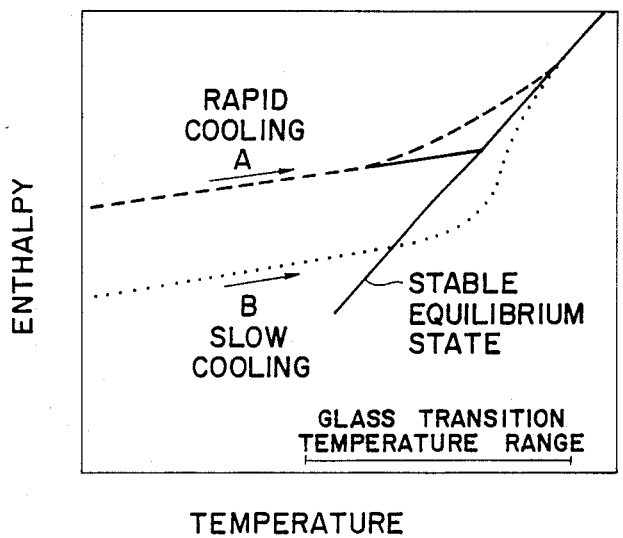
FIG. 2 is a diagram showing variation of enthalpy obtained based on the results of the DSC diagram of FIG. 1.

FIG. 2 is a graph obtained from the DSC curves A and B through integration into enthalpy curves. As indicated by FIG. 2, the resist for the curve A is maintained in a higher enthalpy state than the resist for the curve B. The reason for this is that since the resist for the curve B, which was slowly cooled, is maintained in the Tg region longer than the resist for the curve A, the enthalpy relaxation for the curve B resist proceeds larger than that for the curve A resist. As seen from the curve A of FIG. 2, it can be understood that the resist can be maintained in a high enthalpy state by baking it at a temperature higher than the Tg region and thereafter rapidly cooling it. It is then possible to reduce the resist enthalpy by annealing the resist for a specific time at a temperature within the Tg region. In other words, it becomes possible to adjust the resist sensitivity.

Figure 3:
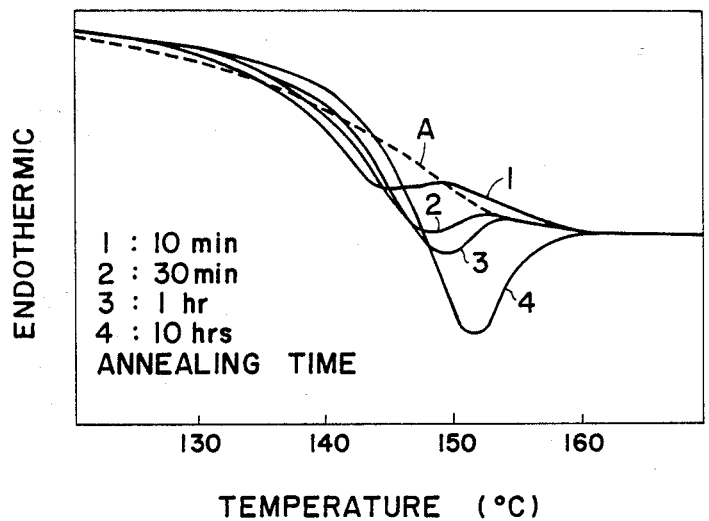
FIG. 3 is a DSC diagram with varying annealing time.

A broken line curve A shown in FIG. 3 represents a DSC curve obtained when a resist is baked at a temperature higher than the Tg region and thereafter cooled rapidly. Solid line curves 1 to 4 represent DSC curves obtained when resists are baked at a temperature higher than the Tg region and thereafter annealed at a temperature within the Tg region. The curves A, 1 to 4 were obtained with a constant temperature of 130° C. and with varied annealing time. From the DSC curves 1 to 4, it can be noted that, the longer the annealing time becomes, the larger becomes the endothermic peak.

Figure 4:
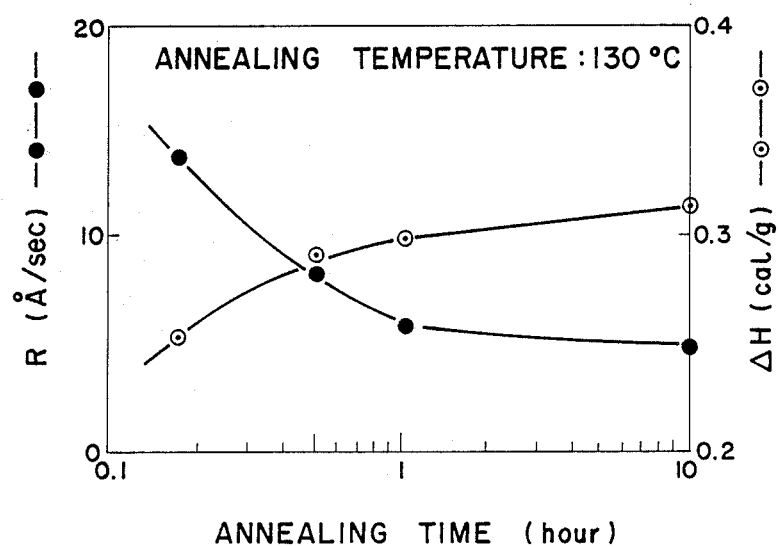
FIG. 4 is a graph indicating resist dissolution rate and reduced enthalpy relative to annealing time.

FIG. 4 shows the reduced enthalpy $\Delta H(cal/g)$ obtained through integration of the DSC curves of FIG. 3 and the resist dissolution rate $R(\text{Å}/sec)$ when the resists after annealing were exposed and patterned at a dose of 1 $\mu C/cm^2$ (where C is coulomb), respectively relative to annealing time. From FIG. 4, it can be seen that when the reduced enthalpy $\Delta H$ increases, the resist dissolution R (sensitivity) deteriorates. The reason for this is that the resist of a large reduced enthalpy $\Delta H$ has a dense volume and hence little voids therein, so that the solvent is not likely to penetrate into the resist.

From the above results, it can be understood that the resist sensitivity can be lowered to the sensitivity (dissolution rate) corresponding to the annealing temperature and time, by baking the resist at a temperature in its Tg region or higher temperature, cooling rapidly to temporarily maintain the resist in a high enthalpy state, and annealing it at a temperature within the Tg region.

The present invention has been made in accordance with the above point of view. More specifically, after a resist has been baked at a temperature in its Tg region or higher temperature, it is rapidly cooled and thereafter subjected to the above described annealing process to adjust the resist sensitivity. Thus, the resist can be exposed properly in accordance with the resist sensitivity to form a resist pattern of high precision.

Figure 5:
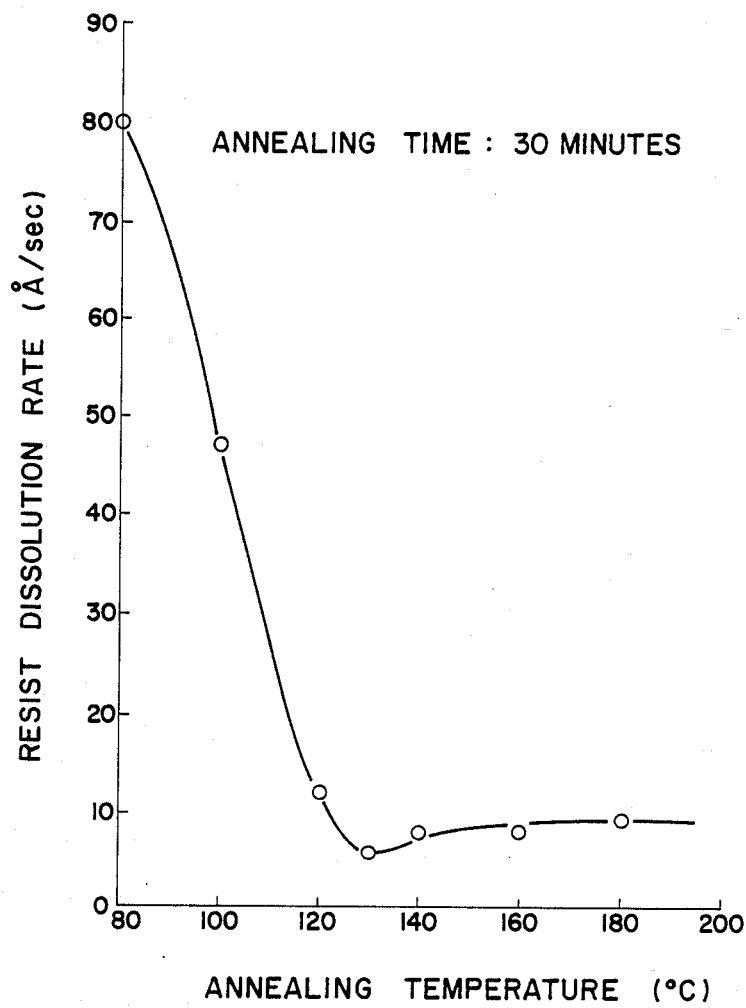
FIG. 5 is a graph indicating resist dissolution rate relative to annealing temperature with a constant annealing time of 30 minutes.

The resist sensitivity adjustment is interrelated not only to the annealing time but also to the annealing temperature. Therefore, in order to practice the present invention, contrary to the case where the annealing time is changed while maintaining the annealing temperature constant as above, the annealing time may be maintained constant while the annealing temperature is changed to accordingly lower the sensitivity. That is, for example, as in FIG. 5 showing a resist dissolution rate relative to annealing time, resists of 2,2,2-gT-α-C coated on substrates were baked at a temperature higher than the Tg region, rapidly cooled, and annealed for 30 minutes In this case, methyl isobutyl keton (MIBK) was used as a development agent for dissolving a resist. The relation between the resist sensitivity and the resist dissolution rate can be obtained through experiments. For example, if a resist of 2,2,2-gT-α-C is used, a proper resist sensitivity with 4 $\mu C/cm^2$ corresponds to a dissolution rate of 20 Å/sec. Therefore, to obtain a sensitivity suitable for a dose of 4 $\mu C/cm^2$, the annealing at 117° C. and for 30 minutes are obtained from FIG. 5. In the above manner, the resist sensitivity is adjusted.

Further, in order to practice the present invention, the resist sensitivity may be adjusted by controlling both the annealing temperature and the annealing time.

FIGS. 6, 7 and 8 show the process steps of the first, second, and third examples of practice of the resist pattern forming method according to the present invention as based on the above considerations.

Referring first to FIG. 6, a resist is coated by the spin coating method on a substrate such as a mask substrate or a wafer substrate (step 1). The coated resist is baked at a temperature in its Tg region or higher temperature (glass transition temperature region) (step 2). Thereafter, the resist is rapidly cooled (step 3) to thereby maintain the resist enthalpy (sensitivity) in a high state as shown by A in FIG. 2. The resist is exposed to electromagnetic waves or corpuscular rays (step 4). After the exposure, the resist is annealed at a temperature within the Tg region to thereby lower the solubility rate R (sensitivity) as shown in FIG. 4, thus achieving the sensitivity adjustment. The sensitivity adjusted resist is developed (step 6). Since the resist sensitivity can be adjusted to a desired value, a resist pattern of high precision can be formed on the substrate.

The annealing process (step 5) for the adjustment of a resist sensitivity may be performed after or before the exposure process (step 4) as long as it is performed after the baking process (step 2) and the rapid cooling process (step 3). Therefore, the annealing process can be performed after the baking and rapid cooling processes as one example.

FIG. 7 shows the process steps of such a modification. First, a resist is coated on a substrate by the spin coating method (step 11). The coated resist is baked at a temperature in its Tg region or higher temperature (step 12) and thereafter rapidly cooled (step 13). The resist is then annealed at a temperature within the Tg region (step 14). Next, the resist is exposed to electromagnetic waves or corpuscular rays (step 15) and thereafter developed (step 16). With the above process steps, an effect similar to that of the first example can be obtained and a resist pattern is formed on the processing substrate.

Alternatively, the resist enthalpy can be maintained in a high state by performing the baking process (step 12) at a temperature in the Tg region or higher temperature and the rapid cooling process (step 13) after the exposure process (step 15).

FIG. 8 shows the process steps of such a modification. First, a resist is coated on a processing substrate by the spin coating method (step 21). The coated resist is pre-baked under an optional condition and thereafter cooled (step 22). With this pre-baking, a solvent for the resist is evaporated to assure good contact of the resist to the processing substrate. The resist is then exposed to electromagnetic waves or corpuscular rays (step 23). After the exposure, the resist is again baked at a temperature in its Tg region or higher temperature (step 24) and thereafter rapidly cooled (step 25). Next, the resist is annealed at a temperature within the Tg region (step 26) and then developed (step 27).

After baking at a temperature in the Tg region or higher temperature, the resist is rapidly cooled to maintain it in a high enthalpy state. By annealing the resist at a temperature within the Tg region, the enthalpy relaxation is adjusted to indirectly adjust the resist sensitivity.

Figure 11:
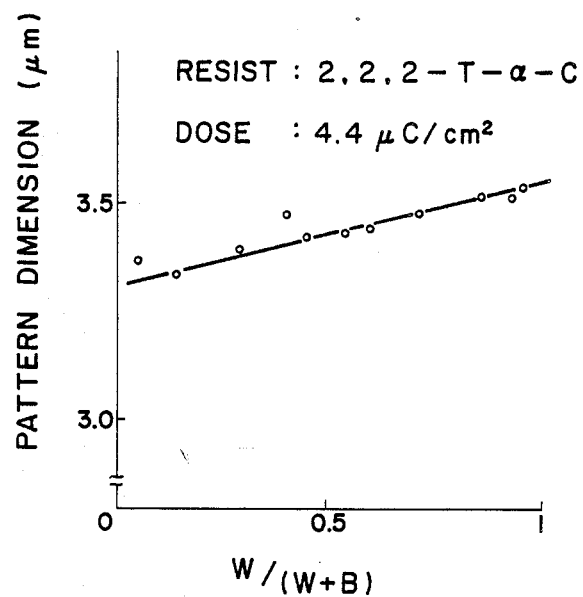
FIG. 11 is a graph showing a relation between a pattern dimension and a pattern black and white ratio.
Figure 12:
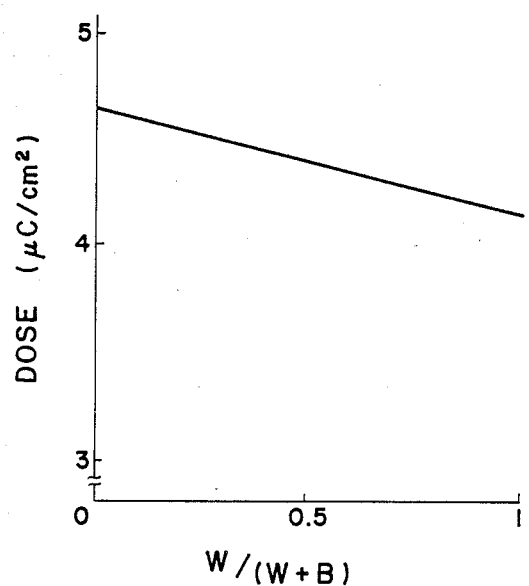
FIG. 12 is a graph showing a dose required to maintain a development time constant, relative to a pattern black and white ratio.

As shown in FIG. 11, the dimension of patterns becomes different depending upon a pattern black and white ratio, even if they are developed for a same time period. This is considered as resulting mainly from the fog phenomenon of reflected electrons. In order to prevent an occurrence of a difference in pattern dimension while maintaining a constant time period of development, it is necessary to compensate for a dose. FIG. 12 shows a relation of a dose relative to a white and black ratio necessary for maintaining a constant development time period.

EXAMPLES

FIRST EXAMPLE

A resist of 2,2,2-T-α-C was coated on a silicon substrate or a mask substrate by the spin coating method to form a resist film having a thickness of 5,000 to 6,000 Å. Next, the resist was baked at 180° C. in a convectional oven. The baking temperature may be in the range of about 150° to 200° C. The substrate was removed from the furnace and placed outside to rapidly cool it at a cooling rate of 160° C./sec. The cooling rate is sufficient if it is 160° C./sec or higher or may be 160° C./sec or lower, e.g., higher than about 50° C./sec. A desired pattern was exposed on the resist of the processing substrate using an electron beam of 0.5 $\mu$m diameter and 440 nA. After the exposure, the resist was annealed within an electric furnace at 130° C. for 5 minutes. Next, the resist was developed at 25° C., using a developing agent MIBK to form a pattern. The annealing temperature and time may be of other values, e.g., 120° C. for 30 minutes.

For comparison of the Example of this invention, a substrate with the baking and rapid cooling processes for the resist performed under the conditions as above, but without the annealing process, was developed under the same conditions as above.

The resultant resist sensitivity without annealing and with development for 3 minutes and 30 seconds was 0.1 $\mu$C/cm². In contrast, the resist sensitivity with annealing was lowered to 4 $\mu$C/cm². From this, it can be confirmed that the sensitivity adjustment was properly performed according to the present invention.

Second Example

Figure 9:
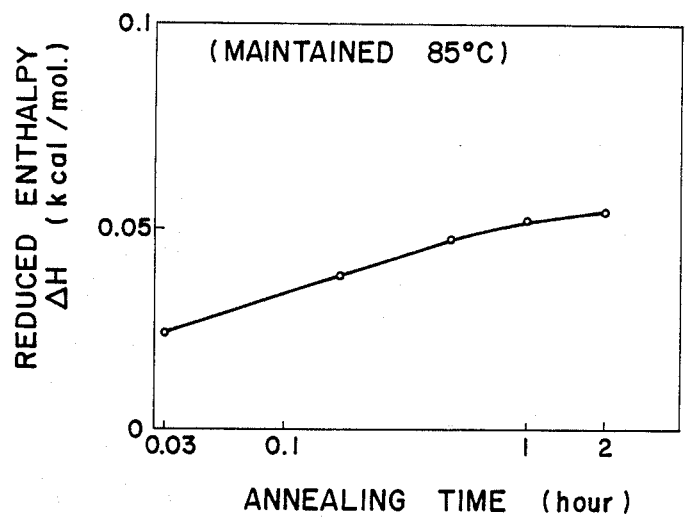
FIG. 9 is a diagram indicating reduced enthalpy for a resist of polybutene-1 sulfone.

A resist of polybutene-1 sulfone (commercial name PBS) was coated on a silicon substrate or a mask substrate by the spin coating method to form a resist film of about 2 $\mu$m thickness. The substrate was baked at 100° C. for one hour and thereafter rapidly cooled at a rate of 100° C./sec or higher. To study the enthalpy relaxation due to the annealing of the poly butene-1 sulfone, the reduced enthalpy was obtained through annealing at 85° C., the results being shown in FIG. 9. Similar to the first Example of 2,2,2-gT-α-C, the longer the annealing time becomes, the reduced enthalpy proceeds as seen from FIG. 9. With the results being related to the resist solubility, the adjustment of solubility, i.e., sensitivity becomes possible.

Third Example

Figure 10:
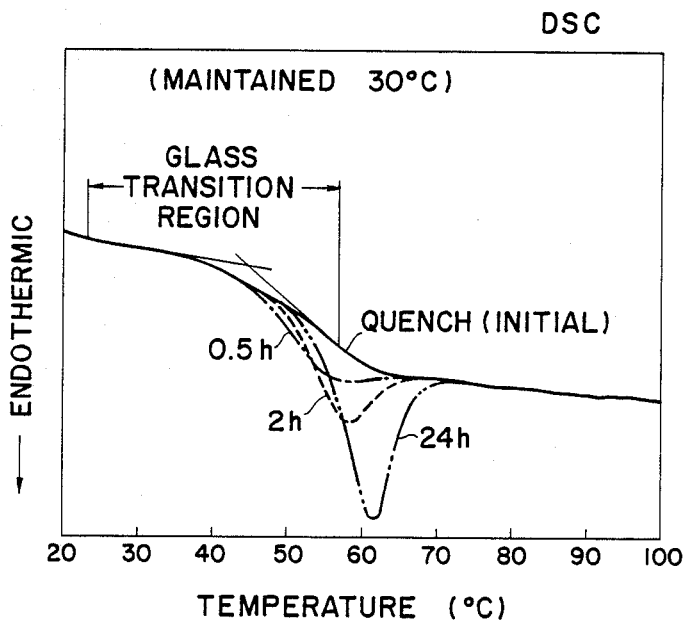
FIG. 10 is a DSC diagram indicating enthalpy relaxation for a resist of a copolymer of hexafluorobutyl methacrylate and glycidyl methacrylate.

A resist made of copolymer, polyhexafluorobutyl methacrylate-co-glycidyl methacrylate (commercial name FBM-G), was coated on a silicon substrate or a mask substrate to form a resist film of about 2 $\mu$m thickness. The substrate was baked at 140° C. for 30 minutes, and thereafter it was rapidly cooled at a rate of 100° C./sec or higher. Then the substrate was left in an environment at 30° C., i.e., was annealed at a low temperature to perform DSC scans on the resist of the substrate and study the change in enthalpy, the results being shown in FIG. 10. From FIG. 10, it can be understood that the endothermic peak, i.e., reduced enthalpy peak becomes large with time. By a quantitative analysis of the reduced enthalpy related to the solubility, the resist sensitivity can be adjusted.

Fourth Example

A mask manufacture process by the electronbeamgraphy will be described specifically in fourth example. On mask blanks, electron sensitive positive type resist 2,2,2-gT-α-C was spin-coated to a thickness of 0.5 $\mu$m and baked at a temperature of 180° C. for one hour using a convection oven, and thereafter rapidly cooled at a cooling rate in 160° C./sec or higher temperature. After an annealing for a predetermined time, they were exposed to form patterns thereon at doses of 1 and 4.4 $\mu$C/cm², respectively, to measure resist dissolution rates at exposed areas. The development was conducted at 25° C. using a solvent MIBK (methyl isobutyl keton) by means of the dip method. The results are shown in FIG. 13. It can be seen that although the sensitivities (dissolution rate) at two different annealing times are not exactly the same within the range shown in FIG. 13, the sensitivity for the dose 1 $\mu$C/cm² for 0.1 annealing hour is substantially equal to that for the dose 4.4 $\mu$C/cm² for 10 hours. Thus, an equivalent condition for a certain sensitivity can be obtained from a graph such as shown in FIG. 14 if a dissolution rate (sensitivity) relative to an annealing time is quantified for each dose. With this method, it is possible to determine a desired sensitivity for any arbitrary effective dose. Further, as seen from FIG. 14, within a certain range of dose, a difference between dissolution rates for a unit change in dose becomes larger when a high dose exposure for a long annealing time is applied, so that a high resolution can be expected.

Next, a method of compensating for a pattern white and black ratio will be described. For example, in case of the above exposure at 4.4 $\mu$C/cm², a relation between a white and black ratio (W/(W+B)) and an optimized dose D is given as shown in FIG. 12 by:

$$D(\mu C/cm^2) = 4.65 - 0.5 \ (W/(W+B))$$

Therefore, a process using a same development time can be realized by using a dose required for a particular pattern white and black ratio obtained from the above equation and by selecting an annealing time for a sensitivity of 4.4 $\mu C/cm^2$. Further an annealing time for a same sensitivity can be obtained from FIG. 15 by preparing a relation of:

$$R(\text{Å}/sec) = R_o - \alpha(W/(W+B))$$

where $R_o$ is a dissolution rate at W=0%, and $\alpha$ is a constant.

What is claimed is:

1. A method of forming a resist pattern comprising the steps of: coating a resist on a substrate,
   baking the coated resist at a temperature in its glass transition temperature region or higher,
   rapidly cooling the baked resist to maintain the enthalpy of the resist in a high state so that the sensitivity of the resist is high,
   exposing the resist to electromagnetic waves or corpuscular rays, and
   developing the exposed resist, wherein said method further comprises the step of annealing said resist at a temperature within said glass transition temperature region after said cooling step and before said developing step for a period of time sufficient to relax the enthalpy of the resist and decrease its sensitivity to a desired value.

2. A method of forming a resist pattern according to claim 1, wherein said cooling step is performed before said exposure step, and said annealing step is performed after said exposure step.

3. A method of forming a resist pattern according to claim 1, wherein said exposure step is performed after said annealing step.

4. A method of forming a resist pattern according to claim 1, wherein at said annealing step an annealing time is controlled to compensate for an excess or deficiency of dose caused by a pattern white and black ratio.

5. A method according to claim 1, consisting essentially of the recited steps.

6. A method according to claim 2, consisting essentially of the recited steps.

7. A method according to claim 3, consisting essentially of the recited steps.

8. A method of forming a resist pattern comprising in order the steps of:
   coating a resist on a processing substrate,
   exposing said coated resist to electromagnetic waves or corpuscular rays,
   baking the exposed resist at a temperature in its glass transition temperature region or higher,
   rapidly cooling the baked resist to maintain its enthalpy in a high state so that the sensitivity of the resist is high,
   annealing the cooled resist to relax the enthalpy of the resist and decrease its sensitivity to a desired value, and
   developing the cooled resist.

9. A method of forming a resist pattern according to claim 8, further comprising the steps of pre-baking and cooling said resist coated on said substrate after said resist coating step and before said exposure step.

10. A method of forming a resist pattern according to claim 8, wherein at said annealing step an annealing time is controlled to compensate for an excess or deficiency of dose caused by a pattern white and black ratio.

11. A method according to claim 8, consisting essentially of the recited steps.

* * * * *